(12) United States Patent
Brandt

(10) Patent No.: US 6,377,124 B1
(45) Date of Patent: Apr. 23, 2002

(54) BIASING ARRANGEMENT FOR FIELD EFFECT TRANSISTORS

(75) Inventor: Per-Olof Magnus Brandt, Staffanstorp (SE)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/547,114

(22) Filed: Apr. 11, 2000

(30) Foreign Application Priority Data

Apr. 13, 1999 (SE) ............................................... 9901304

(51) Int. Cl.⁷ ................................................ H03F 3/16
(52) U.S. Cl. ........................................ 330/277; 330/302
(58) Field of Search ................................. 330/277, 283, 330/296, 302

(56) References Cited

U.S. PATENT DOCUMENTS 4,631,493 A * 12/1986 Vendelin et al. ............. 330/277
5,767,756 A *  6/1998 Hwang ........................ 333/124
6,163,222 A * 12/2000 Kobayashi ................... 330/302

FOREIGN PATENT DOCUMENTS

JP       07240638       9/1995
JP       08078969       3/1996
JP       09283710      10/1997

* cited by examiner

Primary Examiner—Benny Lee
Assistant Examiner—Henry Choe
(74) Attorney, Agent, or Firm—Jenkens & Gilchrist, P.C.

(57) ABSTRACT

A power amplifier is proposed for applications having a low single-ended supply voltage and a high required output power. The amplifier includes a FET with its gate coupled to an input (Pin) and its drain coupled to an output (Pout) via an impedance-matching stage. The transistor gate is biased by an impedance and a source-biasing element shunted by a bypass capacitor couples the source to ground. A common terminal (A) is provided between the transistor source and the impedance matching stage, and is connected to ground through the source-biasing element. This has the effect of raising the impedance at the source perceived by the bypass capacitor. The peak currents passing through the source bypass capacitor can thus be considerably reduced, such as, for example, to a level that would allow the capacitor to be of a more manageable size and to be implemented on a chip.

20 Claims, 3 Drawing Sheets

BIASING ARRANGEMENT FOR FIELD EFFECT TRANSISTORS

FIELD OF INVENTION

The invention relates to an arrangement biasing depletion mode field effect transistors (FET). The invention is particular directed to radio frequency power amplifiers that are utilised for applications combining the need for high power with a low single-ended supply voltage.

BACKGROUND ART

Depletion mode FET's have a negative threshold or pinch-off voltage. This means that if the source of the transistor is at 0 V, the gate voltage must drop below 0 V to turn the transistor off An ac power amplifier of conventional circuit configuration is shown in FIG. 1. In this arrangement a FET 100 is coupled by its gate terminal G to an input through a blocking capacitor 110 and to a negative supply voltage Vneg via a resistor 120. The FET source terminal S is held at ground and the drain terminal D is coupled to the supply voltage Vdd through an inductor (RF choke) 130 and to the output through a resistor 140 and a further blocking capacitor 150. The output power in this arrangement is controlled by the gate voltage of the FET 100. The FET is "on" when the voltage at the gate G equals that at the source S, i.e. when the gate is at ground. To switch the FET "off", the gate must be pulled more negative than the source S by a specified amount; the required voltage difference depends on the type of FET used. If a negative voltage supply is not available, the amplifier can be turned off only by turning off the positive supply voltage Vdd. In practice this is often accomplished using a switch made up of a p-channel MOSFET.

A further way to bias the FET without using a negative supply voltage is to raise the source voltage. Such an arrangement is shown in FIG. 2. In this circuit, the gate terminal G of the FET 100 is connected to ground via a resistor R2 120, and the source terminal is also connected to ground via a resistor R1 160. A bypass capacitor 170 shunts the source resistor R1 160. The resistor R1 160 is suitably selected to enable the FET to be turned off at a desired low gate voltage.

A problem arises with this arrangement when high output power is required but a relatively low supply voltage Vdd is available. This is the case, for example, with GSM mobile phones. In GSM, the power amplifier in mobile phones has a supply voltage of typically 3 V but is required to provide around 3 W output power. As a result, the output impedance of the FET 100 as seen by the next stage is very low, i.e. of the order of a few ohms. For this reason, an impedance matching stage is provided, which in FIG. 2 consists of an inductor 180 connected at a first terminal to the FET drain D and at the second terminal to the output blocking capacitor 150, and a capacitor 190 connecting the inductor's second terminal to ground. However, another, more problematic, consequence of the low supply voltage and high required output power are the high currents in the transistor. For example, in GSM, peak currents of 3A are common. In order for the bypass capacitor 170 to be effective in sinking these currents, it must be very large. For example, with peak currents of 3A in the transistor, a capacitance of around 15 nF would be required. Such a capacitor cannot easily be implemented on chip. It should be noted that for radio frequency (RF) and specifically microwave applications, the capacitor 170 will always have to be large, regardless of the value of the resistor 160. At these frequencies, the resistor 160 will have a significant series inductance. Thus even if the resistance was set to a fraction of an ohm, the bypass capacitor would still have to be prohibitively large for on-chip implementations.

It is thus an object of the present invention to provide an amplifier arrangement that overcomes the problems associated with prior art configurations.

It is a further specific object of the present invention to provide an amplifier arrangement that is suitable for use with a low, single-ended power supply and for RF applications. Preferably, the arrangement should lend itself easily to on-chip implementation.

SUMMARY OF INVENTION

According to the present invention the above object is achieved in a power amplifier including a FET with an input coupled to the gate terminal and an output coupled to the drain terminal via an impedance matching stage connected between the drain terminal and ground. A source biasing element shunted by a bypass capacitor couples the source terminal to ground. According to the invention, a common terminal is provided between the transistor source and the impedance matching stage and this common terminal is connected to ground through the source biasing element By providing a common terminal between the impedance matching components and the transistor source, the impedance looking into the source terminal is effectively defined by the impedance matching components. The peak currents passing through a source bypass capacitor element can thus be considerably reduced, specifically to a level which allow the capacitor to be of a more manageable size, and to be implemented on chip.

The source biasing element may be a resistor, which can be selected to alter the gate-source voltage of the transistor, and so enable the transistor to be turned off.

In a further embodiment of the invention, the source biasing element is a second field effect transistor, preferably a MOSFET, operating as a voltage controlled resistor. In addition to biasing the power amplifier, the second FET can also be used to regulate the power amplifier. Specifically, the current through the power amplifier can be controlled by varying the gate voltage of the second FET.

In a preferred arrangement, the second FET serves as a dc-to-dc converter, at least for low output powers of the amplifier, wherein it is switched and its voltage filtered. In this way, the efficiency of the arrangement is greatly enhanced. The solution is also cost-effective as a single second FET is utilised as a voltage controlled resistor at high output powers and as a switch at low output powers.

According to the invention, the amplifier arrangement is preferably included as at least one stage of a power amplifier for a mobile phone.

The invention also concerns a mobile phone incorporating a power amplifier as described above.

BRIEF DESCRIPTION OF THE DRAWINGS

Further objects and advantages of the present invention will become apparent from the following description of the preferred embodiments that are given by way of example with reference to the accompanying drawings, in which.

DETAILED DESCRIPTION OF THE DRAWINGS

Figure 1:
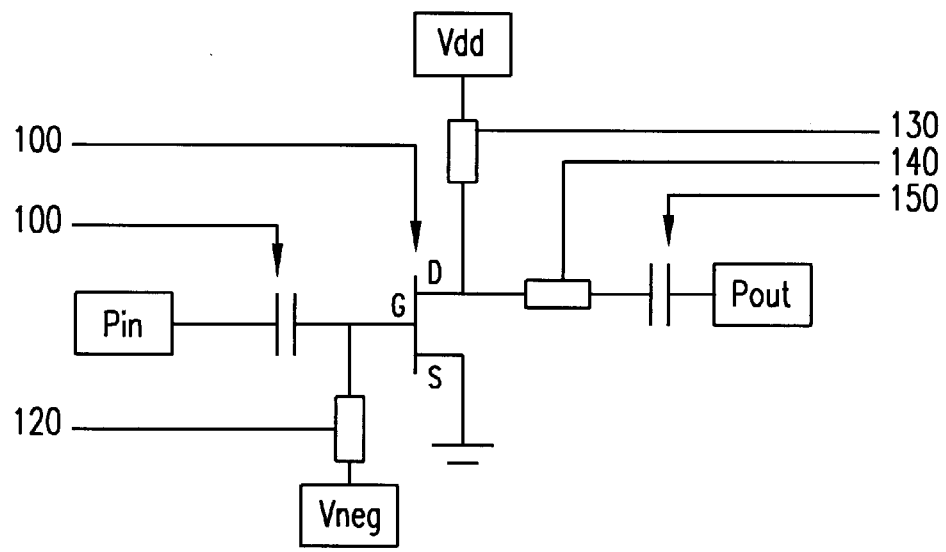
FIG. 1 shows a conventional arrangement of biasing a FET power amplifier circuit with positive and negative supply voltages.
Figure 2:
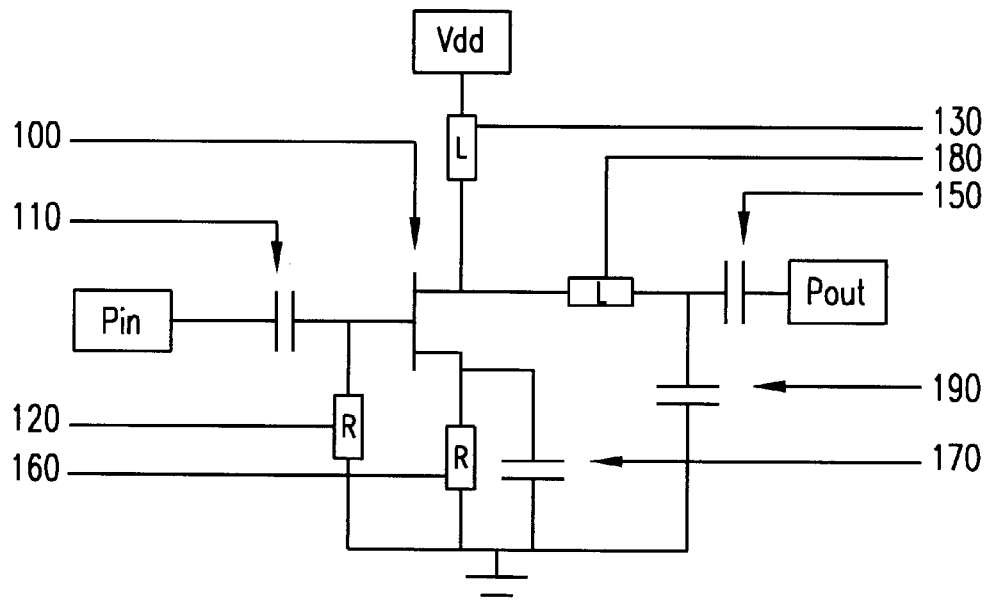
FIG. 2 shows a circuit arrangement for an RF FET power amplifier with a single ended power supply with the FET biased using a source resistor.

The circuits in FIGS. 1 and 2 have already been described the introduction, so further detailed discussion of these arrangements is considered unnecessary here.

Figure 3:
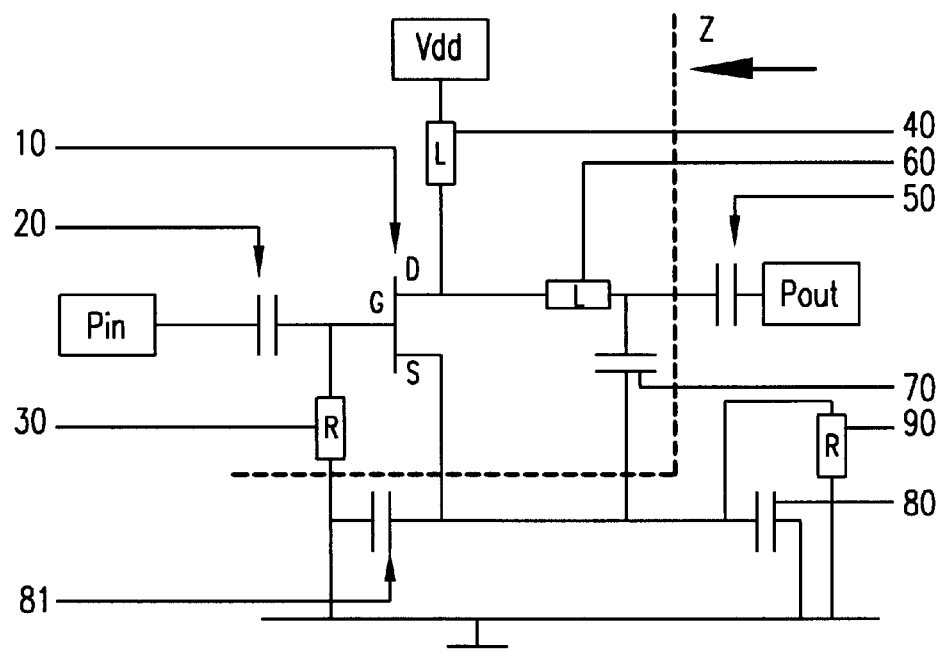
FIG. 3 shows a biasing arrangement for an RF FET power amplifier circuit according to the present invention.

FIG. 3 shows the circuit configuration of a power amplifier. In this embodiment, the power amplifier is specifically for use in a GSM mobile phone. In such a mobile phone, a single-ended supply voltage (Vdd) of around 3 V is used to power the circuit. The power amplifier circuit includes a depletion mode field effect transistor (FET) 10 with gate G, source S and drain D terminals. In the example application the FET 10 is a GaAs MESFET, which is particularly suitable for the high signal frequencies of around 900 Mhz used in GSM due to its high cut-off frequency. However, it will be appreciated that the circuit arrangement can be utilised to the same effect for other depletion mode FETs. The gate terminal is connected to an input Pin to the power amplifier via a blocking capacitor 20. It is assumed in the illustrated example that at least one stage precedes the power amplifier. The gate is further biased by means of a resistor 30 connected between the gate terminal and ground. The drain terminal is connected via an inductor (RF choke) 40 to the positive voltage supply Vdd. It is also connected to an output terminal Pout via a blocking capacitor 50 and a further inductor 60. The inductor 60 forms part of an impedance matching stage, the other part of which is formed by a capacitor 70 connected at one end between the inductor 60 and the blocking capacitor 50 and at the other to a common terminal A. The FET source is also connected to this common terminal A. From the common terminal A two paths are provided to ground. Basically, these are an ac path provided by two capacitors 80 and 81 for the high frequency components and a dc path provided by a resistor 90.

As explained in the introduction with reference to FIG. 2, the impedance matching stage is necessary to couple the very low output impedance of the FET 10 to a following stage. It is intended to simulate a 50 ohm transmission line when viewed from the output Pout. The low output impedance of the FET 10 results from the low supply voltage Vdd and the high output power requirements. The output impedance of the FET is of the order of a few ohms. By providing the common terminal A between the transistor 10 source and the matching components 60, 70 the impedance of the source terminal when viewed from the capacitor 80 and 81 is far higher than when the matching components are connected to ground as shown in FIG. 2. If the arrangement of FIG. 2 were utilised for the power amplifier of a GSM mobile phone, the impedance at the source terminal would be much less than 1 ohm. Conversely, in the arrangement of FIG. 3, the impedance at the source when viewed from the bypass capacitor 80 is determined by the matching components. In other words the capacitor 80 sees a 50 ohm transmission line. In effect, the provision of the common terminal A for the FET 10 amplifier and the matching components 60, 70 shifts the biasing resistor 90 to the right of the high impedance portion. This is illustrated by the dashed line Z, which indicates the interface between the high and low impedance areas of the circuit. The capacitor 81 is also located beyond the high impedance interface. As a result of the effective increase in output impedance at the FET 10 source, the peak currents carried by the capacitors 80 and 81 are more manageable than in the circuit shown in FIG. 2. The capacitors can therefore be far smaller and specifically, of a size that allows them to be implemented on chip.

For a GSM application, typical values for the components are as follows: a capacitance of 12 pF and an inductance of 2 nH for the matching components 60, 70, and values of 30 pF for the remaining capacitors, that is the input and output blocking capacitors 20, 50 and the two bypass capacitors 80, 81.

It should be noted that the second bypass capacitor 81 is provided as a precaution for high frequency applications where the physical size of the transistor 10 makes a second connection to ground preferable. However, it should be appreciated that the bypass function could be adequately performed by a single capacitor.

In the arrangement of FIG. 3, the gate-source voltage of the FET power amplifier 10 can be varied by varying the resistance of the source bias resistor 90. Alternatively, the resistor could by used to change the drain-source voltage to the MESFET 10 by putting the gate bias resistor 30 at the same potential as the source terminal. Such an arrangement may be of interest if the phase had to be kept constant, for instance.

Figure 4:
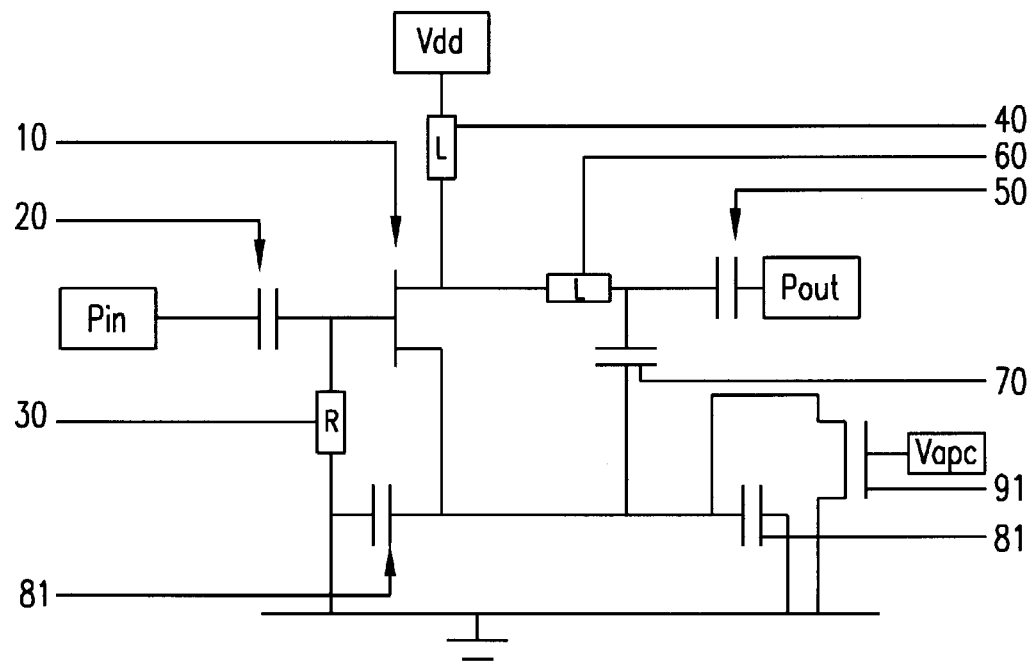
FIG. 4 shows a further embodiment of the biasing arrangement according to the invention, which also serves as a means for regulating the power amplifier.

An alternative embodiment of the invention is shown in FIG. 4. This circuit is very similar to that of FIG. 3, accordingly, like reference numerals are used to denote like parts. The sole difference between the circuits is the replacement in the circuit of FIG. 4 of the source dc bias resistor by an n-channel MOSFET 91. This transistor 91 operates in the linear region of its output characteristic thus serving as a voltage controlled resistor, with the resistance between the common terminal A and ground being controlled by the gate voltage Vapc. Varying the gate voltage Vapc of the MOSFET 91 changes the current through the power amplifier.

In this configuration, the MOSFET 91 need not only be utilised to bias the power amplifier but can be used to regulate it. Thus the output power Pout is controlled by controlling the gate voltage Vapc of the MOSFET 91 rather then by altering the gate voltage of the FET 10. While this arrangement results in some drain-source voltage being lost at low output powers, this is not critical for applications with a constant load, where the extra voltage obtained in the gate controlled regulation is not needed anyway.

However, this loss of drain-source voltage can be avoided by switching the MOSFET 91 and filtering its voltage, in effect by creating a dc-to-dc converter. A particularly cost-effective solution would be to utilise the MOSFET 91 as a voltage controlled resistor at high output powers and as a switch at low output powers. It will also be apparent to those skilled in the art that another form of dc-to-dc converter could be used in place of the MOSFET 91.

Figure 5:
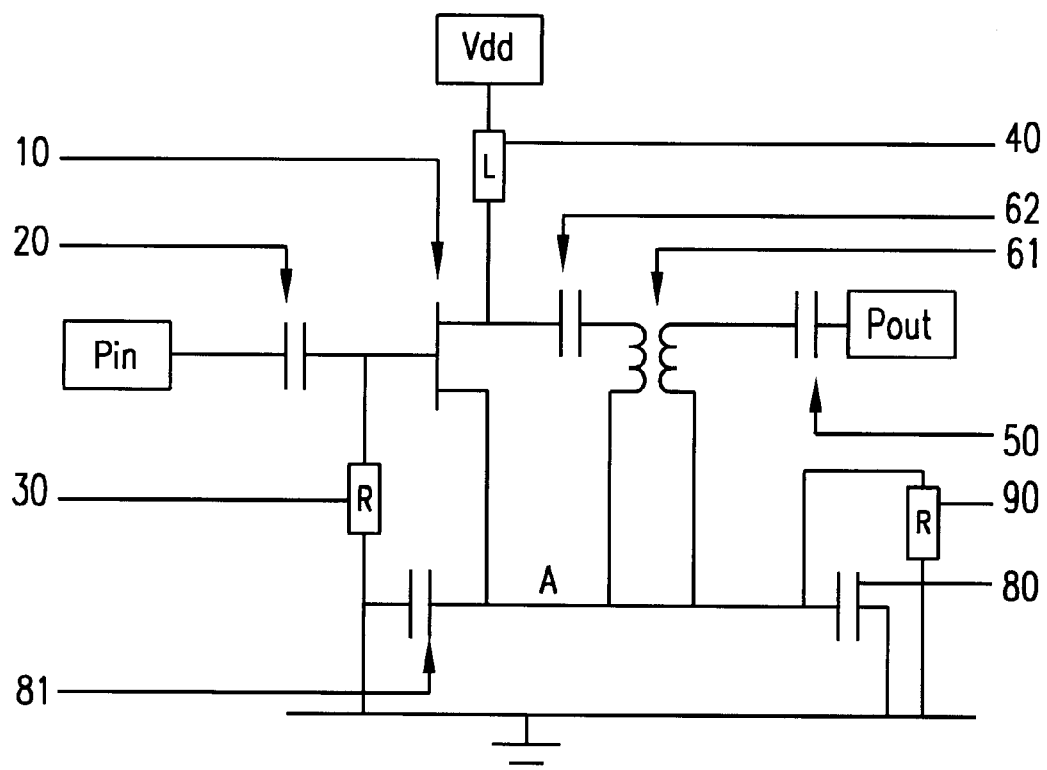
FIG. 5 shows an alternative embodiment of the biasing arrangement according to the invention including a transformer.

FIG. 5 shows a farther embodiment of the arrangement shown in FIG. 3. Again in this circuit like parts are denoted by like reference numerals. This circuit differs from that of FIG. 3 in that the impedance matching stage is constituted by a transformer 61. Specifically, the transformer 61 comprises two coils. The first coil is connected to the drain terminal of the FET 10 via a dc blocking capacitor 62 and to the common terminal A. The second coil is connected between the output blocking capacitor 50 and the common terminal A. The impedance matching properties of a transformer are well known in the art and will not be detailed here. Suffice to say that in the configuration given in FIG. 5 the impedance perceived by the capacitor 80 at the common terminal A or source of the FET 10 is defined by the transformer 61. As for the arrangements in FIGS. 3 and 4, the impedance for GSM applications is preferably of the order of 50 ohms.

Obviously, the biasing resistor 90 of FIG. 5 can be replaced by a FET switch, preferably an n-channel MOSFET 91 to create an analogous circuit to that shown in shown in FIG. 4.

It will be understood by those skilled in the art that the amplifier circuits shown in FIGS. 3 to 5 could be utilised as they stand, or alternatively be incorporated as a single stage in a multi-stage power amplifier, for example for a mobile phone.

What is claimed is:

1. An amplifier comprising:

a field effect transistor having gate, source and drain terminals, wherein an input (Pin) is coupled to the gate terminal and an output (Pout) is coupled to said drain terminal via an impedance matching stage connected between the drain terminal and ground;

source biasing means coupling the source terminal to ground; and a common terminal directly connected to the source terminal and the impedance marching stage, wherein said common terminal is connected to ground through the source biasing means.

2. An amplifier as claimed in claim 1, wherein said source biasing means is shunted by a bypass capacitance.

3. An amplifier as claimed in claim 2, wherein said impedance matching stage comprises an inductance coupled between said drain terminal and the output (Pout) and a second capacitance coupled between said output and the common terminal.

4. An amplifier comprising:

a field effect transistor having gate, source and drain terminals, wherein an input (Pin) is coupled to the gate terminal and an output (Pout) is coupled to said drain terminal via an impedance matching stage connected between the drain terminal and ground;

source biasing means coupling the source terminal to ground; and a common terminal provided between the source terminal and the impedance matching stage, wherein said common terminal is connected to ground through the source biasing means and wherein the impedance matching stage comprises a transformer having a first coil coupled between the drain terminal and the common terminal and a second coil connected between the output (Pout) and the common terminal.

5. An amplifier as claimed in claim 4, further comprising gate biasing means that includes a resistance.

6. An amplifier as claimed in claim 5, wherein the source biasing means comprises a resistance.

7. An amplifier as claimed in claim 4, wherein the source biasing means comprises a dc-to-dc converter.

8. An amplifier as claimed in claim 4, wherein the source biasing means comprises a second field effect transistor.

9. An amplifier as claimed in claim 8, wherein the second field effect transistor is switched for at least low amplifier output powers.

10. An amplifier as claimed in claim 9, wherein the second field effect transistor is a MOSFET.

11. An amplifier as claimed in claim 1, further comprising gate biasing means that includes a resistance.

12. An amplifier as claimed in claims 11, wherein the source biasing means comprises a resistance.

13. An amplifier as claimed in claim 1, wherein the source biasing means comprises a dc-to-dc converter.

14. An amplifier as claimed in claim 1, wherein the source biasing means comprises a second field effect transistor.

15. An amplifier as claimed in claims 14, wherein the second field effect transistor is switched for at least low amplifier output powers.

16. An amplifier as claimed in claim 14, wherein the second field effect transistor is a MOSFET.

17. An amplifier as claimed in claim 15, wherein the second field effect transistor is a MOSFET.

18. An amplifier as claimed in claim 2, further comprising gate biasing means that includes a resistance.

19. An amplifier as claimed in claim 2, wherein the source biasing means comprises a resistance.

20. An amplifier as claimed in claim 2, wherein the source biasing means comprises a dc-to-dc converter.

* * * * *

UNITED STATES PATENT AND TRADEMARK OFFICE
CERTIFICATE OF CORRECTION

PATENT NO. : 6,377,124 B1
DATED : April 23, 2002
INVENTOR(S) : Per-Olof Magnus Brandt It is certified that error appears in the above-identified patent and that said Letters Patent is hereby corrected as shown below:

Title page,
Item [73], Assignee, after "Ericsson" insert -- (publ) --.

Column 1,
Line 17, after "transistor off" insert -- . --

Column 4,
Line 59, replace "farther" with -- further --

Column 5,
Line 27, replace "marching" with -- matching --

Signed and Sealed this

Twenty-second Day of April, 2003

JAMES E. ROGAN
*Director of the United States Patent and Trademark Office*